(12) United States Patent  
Ha

(10) Patent No.: US 6,275,275 B1
(45) Date of Patent: Aug. 14, 2001

(54) THIN FILM TRANSISTOR AND FABRICATING METHOD THEREOF AN INSULATING LAYER HAVING A PATTERN NOT BEING IN CONTACT WITH SOURCE OR DRAIN ELECTRODE

(75) Inventor: Yong Min Ha, Kyongki-do (KR)

(73) Assignee: LG.Philips LCD. Co., Ltd., Seoul (KR)

( * ) Notice: Subject to any disclaimer, the term of this patent is extended or adjusted under 35 U.S.C. 154(b) by 0 days.

(21) Appl. No.: 09/705,713

(22) Filed: Nov. 6, 2000

Related U.S. Application Data

(63) Continuation of application No. 09/410,097, filed on Oct. 1, 1999, now Pat. No. 6,166,785.

(30) Foreign Application Priority Data

Oct. 2, 1998 (JP) .................................... 10-41609

(51) Int. Cl.[7] .................................................... G02F 1/136
(52) U.S. Cl. ................................. 349/42; 349/41; 349/43
(58) Field of Search ................................ 349/42, 43, 41, 349/47; 257/59, 72; 438/30, 164, 299

(56) References Cited

U.S. PATENT DOCUMENTS 5,731,856 * 3/1998 Kim et al. .............................. 349/43
5,767,530 * 6/1998 Ha .......................................... 257/72
5,940,151 * 8/1999 Ha .......................................... 349/43
6,166,785 * 12/2000 Ha .......................................... 349/42

* cited by examiner

Primary Examiner—Kenneth Parker
Assistant Examiner—Mike Qi
(74) Attorney, Agent, or Firm—Long, Aldridge & Norman LLP

(57) ABSTRACT

The present invention relates to a thin film transistor and a fabricating method thereof which is applied to a buried bus coplanar type TFT wherein the source and drain wires are located on a substrate. The present invention includes an insulated substrate, a source electrode and a drain electrode on the insulated substrate, a first insulating layer on the insulated substrate wherein the first insulating layer has a predetermined pattern, an active layer on the first insulating layer wherein the active layer has a source region, a channel region and a drain region, a second insulating layer covering the active layer, and a gate electrode on the second insulating layer over the channel region.

17 Claims, 12 Drawing Sheets

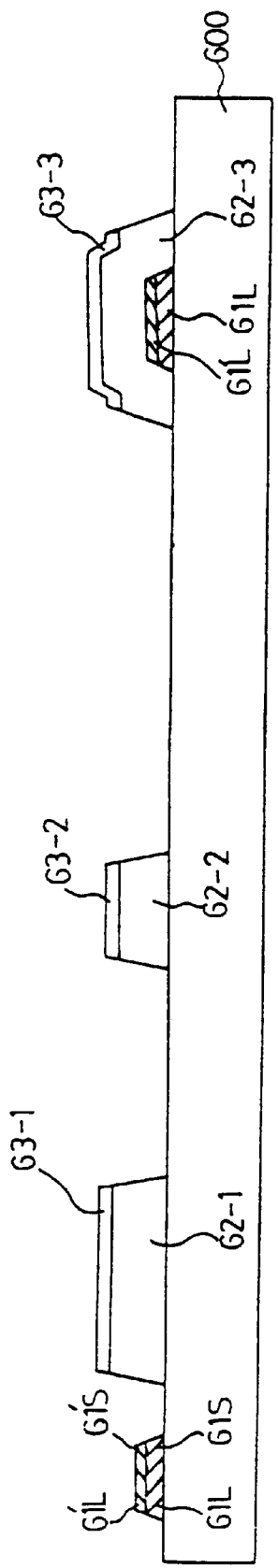
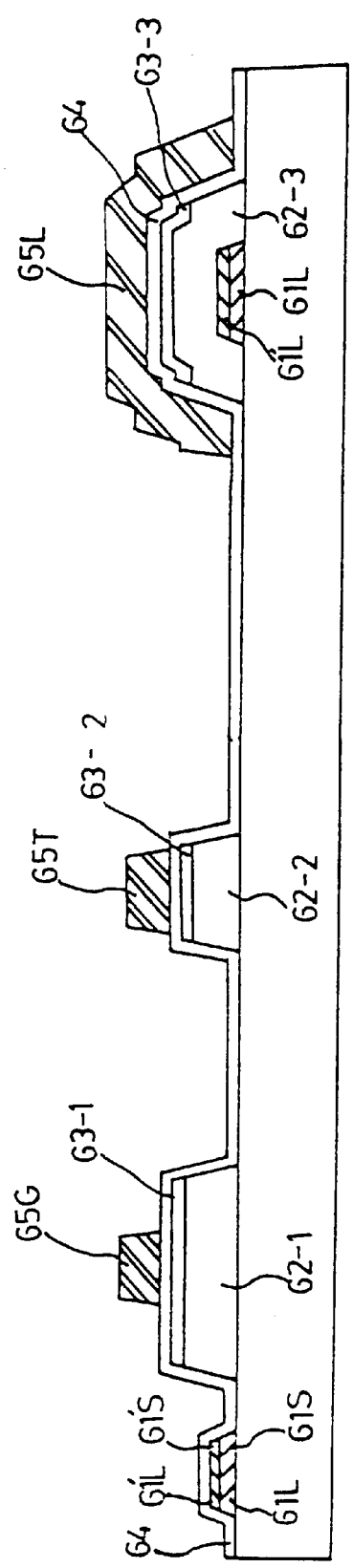

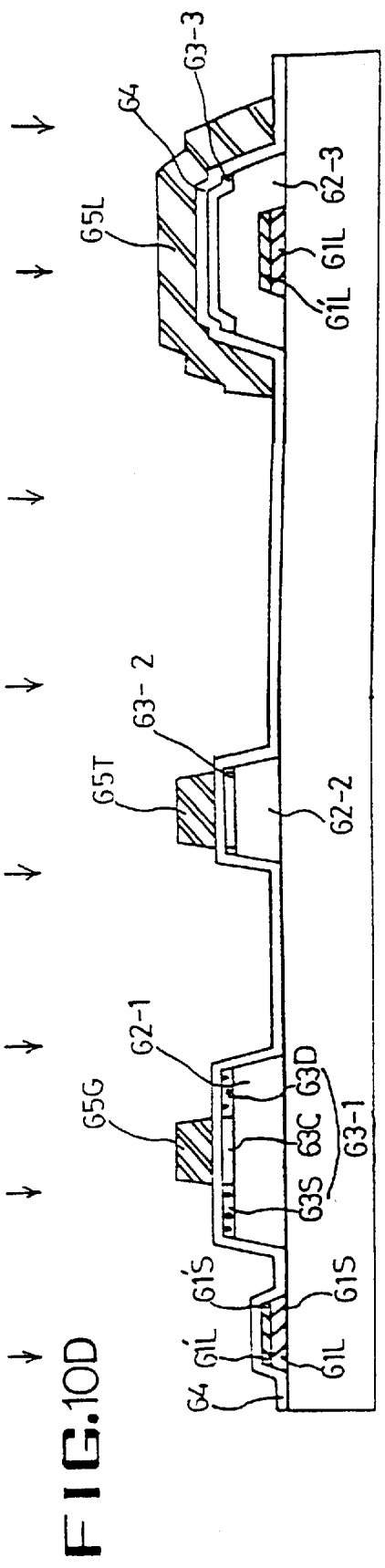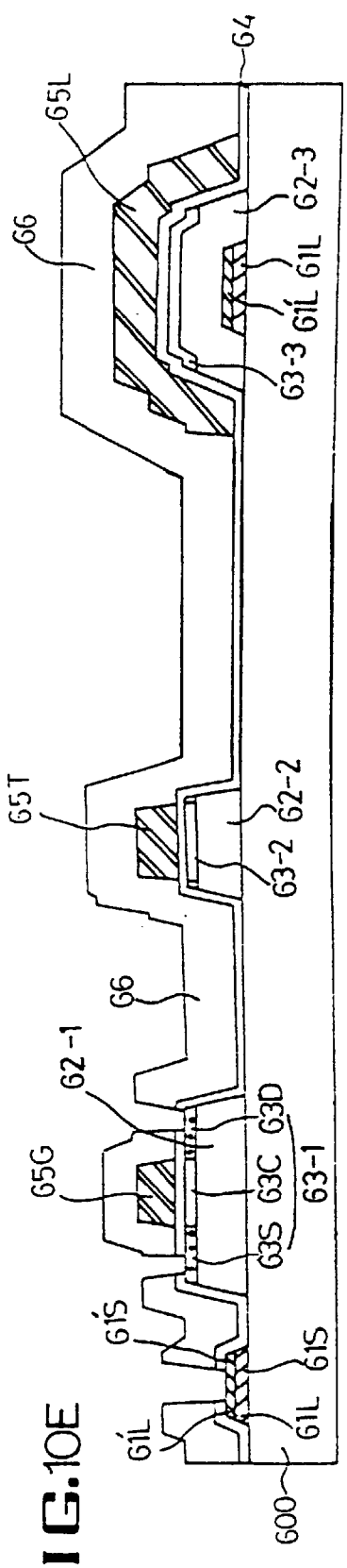

THIN FILM TRANSISTOR AND FABRICATING METHOD THEREOF AN INSULATING LAYER HAVING A PATTERN NOT BEING IN CONTACT WITH SOURCE OR DRAIN ELECTRODE

CROSS REFERENCE TO RELATED ART

This application is a continuation of Ser. No. 09/410,097 filed Oct. 1, 1999, U.S. Pat. No. 6,166,785.

This application claims the benefit of Korean Patent Application No. 1998-41609, filed on Oct. 2, 1998, which is hereby incorporated by reference.

BACKGROUND OF THE INVENTION

1. Field of Invention

The present invention relates to a thin film transistor and a fabricating method thereof which is applied to a buried bus coplanar (BC) type wherein source and drain wires are located on a substrate.

2. Discussion of Related Art

FIGS. 1A to 1D show cross-sectional views of fabricating a thin film transistor according to a related art. Referring to FIG. 1A, first and second conductive layers are deposited successively on a substrate 100. A source electrode 10S and a drain electrode 10D, which are double layers, are formed by etching the first and second conductive layer by photolithography. Then, an insulating interlayer 12 which covers an exposed surface of the substrate is formed with an insulating substance.

Having been deposited on the insulating interlayer 12, an amorphous silicon layer is crystallized by laser crystallization. Then, an active layer 13 is formed by etching the crystallized silicon layer by photolithography.

Referring to FIG. 1B, a gate insulating layer and a third conductive layer are deposited successively on an exposed surface of the substrate. A gate electrode 15 is formed by etching the third conductive layer. In this case, the gate insulating layer 14 is also patterned to have the same pattern as the gate electrode 15. Thereafter, a source region 13S and a drain region 13D are formed by doping the active layer 13 with a first type of impurity which is of n type or a second type of impurity which is of p type.

Referring to FIG. 1C, a passivation layer covering an exposed surface of the substrate 100 is formed. Contact holes exposing the source and drain electrodes 10S and 10D and the source and drain regions 13S and 13D, respectively, are formed in the passivation layer 16 and the insulating interlayer 12.

Referring to FIG. 1D, after a transparent conductive layer has been deposited on an exposed surface of the substrate, a first interconnection wire 17-1 connecting the source electrode 10S to the source region 13S and a second interconnection wire 17-2 connecting the drain electrode 10D to the drain region 13D are formed by etching the conductive layer by photolithography. In the related art, the contact holes exposing the source and drain electrodes and the source and drain regions are formed by once etching the insulating interlayer and the passivation layer.

However, the double-layered insulating layer comprised of the passivation layer 16 and the insulating interlayer 12 has to be etched to expose the source and drain electrodes, while the passivation layer is only etched to expose the source and drain regions; that is, the passivation layer 16 is exposed to an etchant, such as an etching solution and an etching gas. Then, the passivation layer 16 starts to be etched away while the insulating interlayer 12 and the source and drain regions 13S and 13D, which are parts of the active layer, are exposed to the etchant. Thus, the etching process of forming the contact holes is terminated by exposing the source and drain electrodes 10S and 10D, as the insulating interlayer 12 is etched.

According to the related art, the thickness of an insulating substance layer near the contact holes, which are formed on the active layer, is different from that of the insulating substance layer near the other contact holes which are formed on the source and drain electrodes. Thus, the processing problems occur since the contact holes are formed by etching the insulating layer, which thickness is not uniform. These problems are explained in the following descriptions by referring to FIGS. 2–4.

FIG. 2 is a cross-sectional view explaining the problems caused during the step of forming contact holes wherein an insulating interlayer and a passivation layer are formed with the same substance. Referring to FIG. 2, an insulating interlayer and a passivation layer are formed with the same substance. When contact holes are formed by etching the layers, source and drain regions 13S and 13D in an active layer are damaged by an etchant or an etching gas for etching the insulating layers.

This is why the portions of the active layer are exposed to the etchant for a relatively long time despite the etchant having an excellent etch selectivity. In this case, the device characteristics are inferior due to the increased contact resistance between a transparent conductive layer and the damaged source and drain regions 13S and 13D.

In order to improve the device characteristics and to increase the device reliance by preventing $H_2O$ penetration, the insulating interlayer and the passivation layer use a silicon oxide layer and a silicon nitride layer, respectively. Unfortunately, two kinds of problems show up due to different etching rates of the two layers against one etchant.

The first problem is caused by using an etchant which etches the passivation layer faster than the insulating interlayer.

FIG. 3 shows a cross-sectional view explaining the problem arising when contact holes are formed by using an etchant having a high etch rate in etching a passivation layer.

Referring to FIG. 3, a passivation layer 16 is etched selectively and primarily by an etchant having an etch selectivity, such as an etching solution or an etching gas, wherein priority prevails in the passivation layer 16 rather than an insulating interlayer 12.

The insulating interlayer 12 is exposed at a portion where the passivation layer 16 is removed, and then the insulating interlayer 12 is etched selectively. Yet, exposed to the etchant during the etching process of the insulating interlayer 12, the passivation layer 16 is still being etched. In this case, as the etchant etches the passivation layer faster than the insulating interlayer, the passivation layer is etched more than the insulating interlayer. As a result, regions of the contact holes become wider than those regions defined by a photoresist pattern, even though the process of etching the insulating interlayer 12 is carried out according to the design rule.

Moreover, as portions of the active layer are exposed to the etchant for a relatively long time, the source and drain regions 13S and 13D are damaged. In this case, device characteristics fail to show normality due to the increased contact resistance between the transparent conductive layer and the damaged source and drain regions 13S and 13D.

The second problem is caused by using an etchant which etches the insulating interlayer faster than the passivation layer.

FIG. 4 shows a cross-sectional view explaining the problem which arises when contact holes are formed by using an etchant having a high etch rate in etching an insulating interlayer.

Referring to FIG. 4, a passivation layer 16 is etched selectively and primarily by an etchant having an etch selectivity, such as an etching solution or an etching gas, wherein priority prevails in the insulating interlayer 12 rather than the passivation layer 16.

The insulating interlayer 12 is exposed at a portion where the passivation layer 16 is removed, and then the insulating interlayer 12 is etched selectively by the penetrating etchant. While the passivation layer 16 is still being etched as defined by a photoresist pattern PR, the insulating interlayer 12 is also etched by the penetrating etchant. In this case, as the etchant etches the insulating interlayer faster than the passivation layer, the insulating interlayer is etched more than the passivation layer. As a result, the passivation layer 16 is just etched as is defined by the photoresist pattern PR. Yet, the insulating interlayer may be over-etched.

For instance, the passivation layer and the insulating interlayer are made of silicon nitride, and the etching process is carried out by HF which etches silicon nitride faster than silicon oxide, whereby failure of interconnection wires of transparent conductive substance may arise due to the generation of undercutting.

SUMMARY OF THE INVENTION

Accordingly, the present invention is directed to a thin film transistor and a fabricating method thereof that substantially obviate one or more of the problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes an insulated substrate, a source electrode and a drain electrode on the insulated substrate, a first insulating layer on the insulated substrate wherein the first insulating layer has a predetermined pattern, an active layer on the first insulating layer wherein the active layer has a source region, a channel region and a drain region, a second insulating layer covering the active layer, and a gate electrode on the second insulating layer over the channel region.

In another aspect, the present invention includes the steps of forming a source electrode and a drain electrode on an insulated substrate, depositing a first insulating layer on a surface of the substrate including the source and drain electrodes, forming an active layer on the first insulating layer, exposing the source and drain electrodes by etching the first insulating layer by use of the active layer as a mask, depositing a second insulating layer covering an exposed surface of the substrate including the active layer and the source and drain electrodes, forming a gate electrode on the second insulating layer over the active layer, and forming a source region and a drain region by doping the active layer by use of the gate electrode as a mask.

In another aspect, the present invention includes an insulated substrate, a data line on the insulated substrate wherein the data line has a source electrode, a first insulating layer on the insulated substrate wherein the first insulating layer has a predetermined pattern, an active layer on the first insulating layer wherein the active layer has a source region, a channel region and a drain region, a second insulating layer covering an exposed surface of the substrate including the active layer and the data line, a gate line on the second insulating layer over the channel region wherein the gate line and the data line cross each other and which has a gate electrode, a third insulating layer on an exposed surface of the substrate including the gate line, contact holes exposing the source electrode, the source region and the drain region, an interconnection wire connecting the source electrode to the source region, and a pixel electrode connected to the drain region.

In a further aspect, the present invention includes the steps of forming a data line having a source electrode on an insulated substrate, depositing a first insulating layer on an exposed surface of the substrate including the data line, depositing an amorphous silicon layer on the first insulating layer, forming a polycrystalline silicon layer by crystallizing the amorphous silicon layer, forming an active layer by etching the polycrystalline silicon layer by photolithography, exposing the data line by etching the first insulating layer in use of the active layer as a mask, depositing a second insulating layer on an exposed surface of the substrate including the active layer and the data line, forming a gate line on the insulating layer over the active layer wherein the gate line having a gate electrode and the data line cross each other, forming a source region and a drain region in the active layer by doping the active layer with impurities when using the gate electrode as a mask, depositing a third insulating layer covering an exposed surface of the substrate including the gate line, forming contact holes exposing the source electrode and the source and drain regions in the second and third insulating layers, and forming an interconnection wire connecting the source electrode to the source region and a pixel electrode connected to the drain region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principles of the invention.

In the drawings:

FIGS. 10A to 10F show cross-sectional views of fabricating the liquid crystal display shown in FIG. 9.

DETAILED DESCRIPTION OF PREFERRED EMBODIMENTS

Reference will now be made in detail to the preferred embodiments of the present invention, examples of which are illustrated in the accompanying drawings.

Figure 1A:
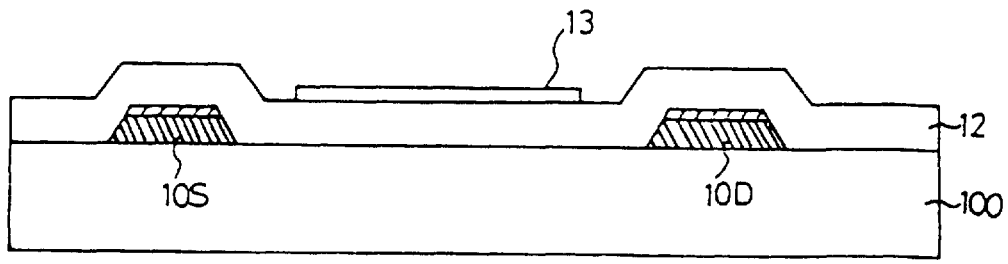
FIGS. 1A to 1D show cross-sectional views of fabricating a thin film transistor according to a related art.
Figure 1B:
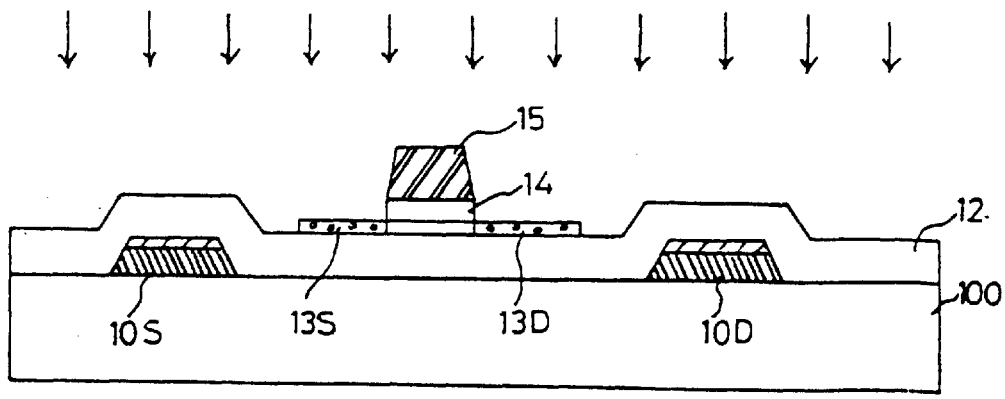
Figure 1C:
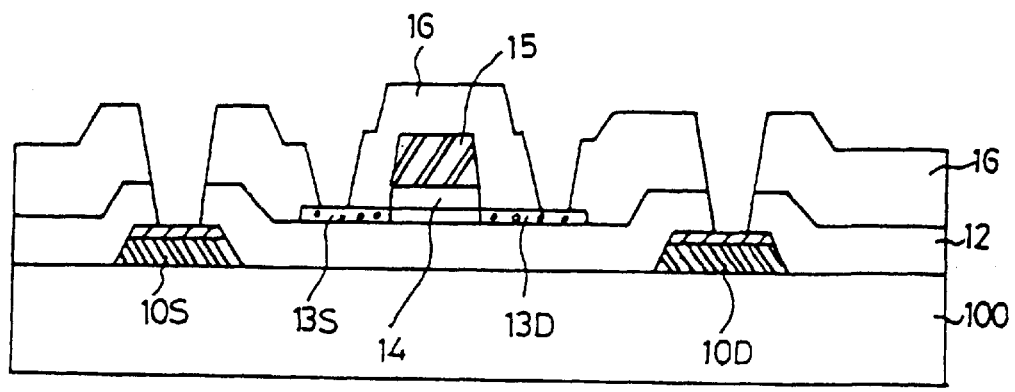
Figure 1D:
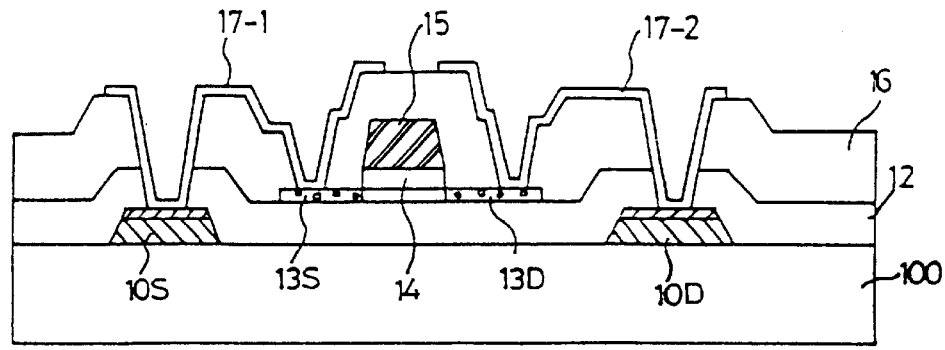
Figure 2:
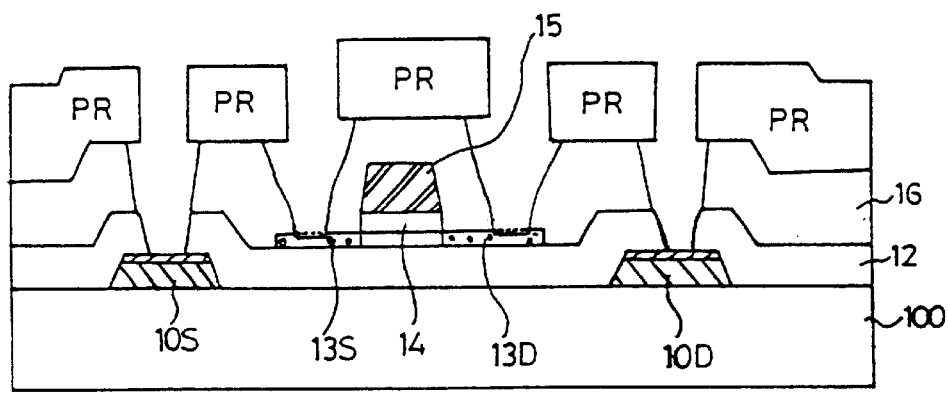
FIG. 2 is a cross-sectional view explaining the problems caused during the step of forming contact holes wherein an insulating interlayer and a passivation layer are formed with the same substance.
Figure 3:
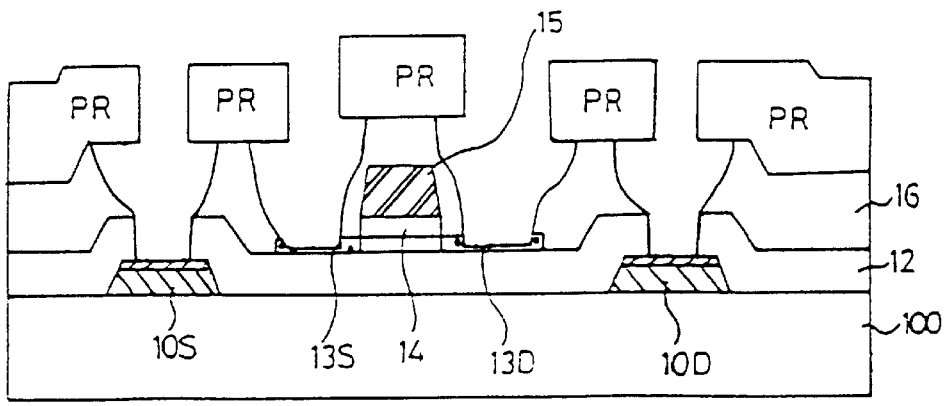
FIG. 3 shows a cross-sectional view explaining the problem arising when contact holes are formed by using an etchant having a high etch rate in etching a passivation layer.
Figure 4:
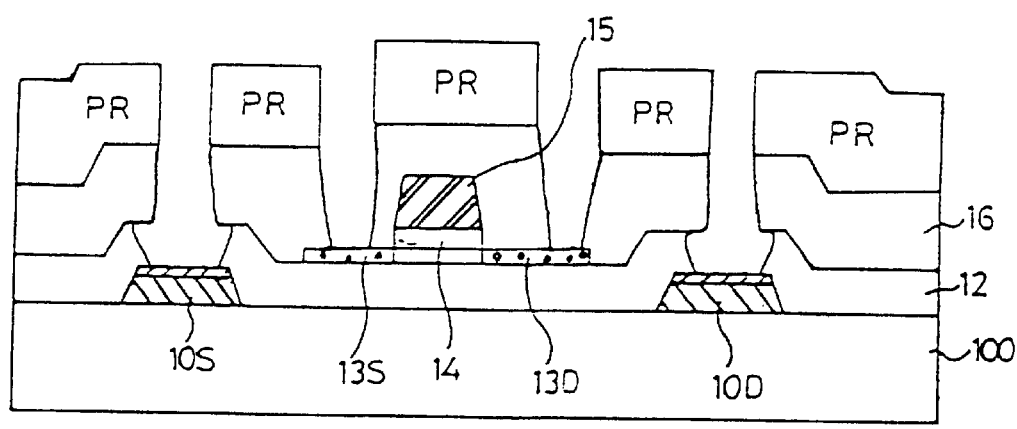
FIG. 4 shows a cross-sectional view explaining the problem arising when contact holes are formed by using an etchant having a high etch rate in etching an insulating interlayer.
Figure 5:
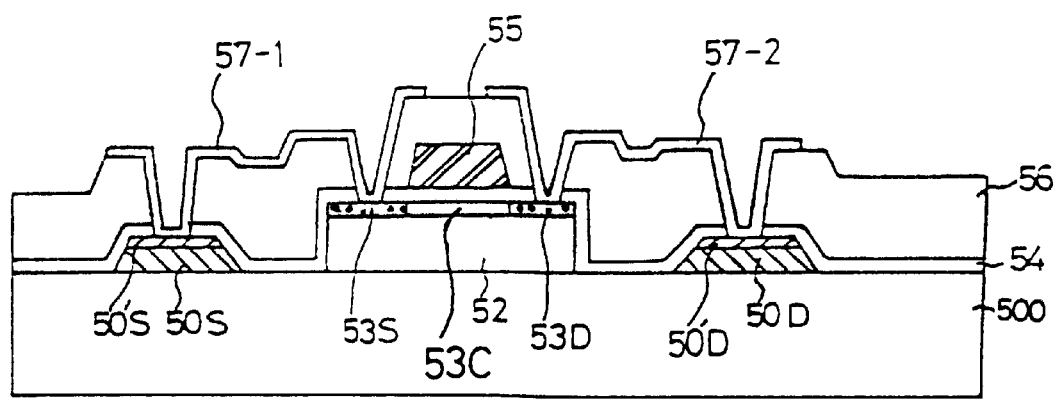
FIG. 5 shows a cross-sectional view of a thin film transistor according to a first embodiment of the present invention.

FIG. 5 shows a cross-sectional view of a thin film transistor according to a first embodiment of the present invention.

Referring to FIG. 5, source and drain electrodes 50S, 50'S, 50D and 50'D, which include double layers, are formed on an insulated substrate 500, and an insulating interlayer 52 is patterned on a predetermined portion of the substrate.

An active layer 53, having source, channel and drain regions 53S, 53C and 53D, is formed on the insulating interlayer 52. A gate insulating layer 54 covers an exposed surface of the substrate 500, including the source and drain electrodes 50S and 50D and the active layer 53. A gate electrode 55 is formed on the gate insulating layer 54 over the channel region 53C.

A passivation layer 56 covers an exposed surface of the substrate 500, including the gate electrode 55 and the insulating layer 54. Contact holes exposing the source and drain electrodes 50S, 50'S, 50D and 50'D and the source and drain regions 53S and 53D are formed on the passivation layer 56 and the gate insulating layer 54.

A first interconnection wire 57-1, connecting the source electrode 50S to the source region 53S, and a second interconnection wire, connecting the drain region 53D to the drain electrodes 50D and 50'D, are formed on the passivation layer 56. In this case, the source and drain electrodes may be formed with at least one layer.

Figure 6A:
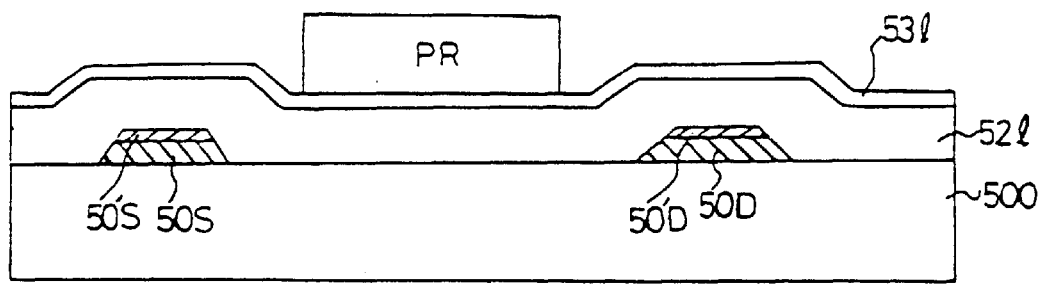
FIGS. 6A to 6F show cross-sectional views of fabricating the thin film transistor shown in FIG. 5.

FIGS. 6A to 6F show cross-sectional views of fabricating the thin film transistor shown in FIG. 5. Referring to FIG. 6A, after source and drain electrodes 50S, 50'S, 50D and 50'D of double layers have been formed on an insulated substrate 500, an insulating interlayer 52 1 covering an exposed surface of the substrate is formed.

After an amorphous silicon layer about 500Å thick has been deposited on the insulating interlayer 52 1, the amorphous silicon layer is crystallized into a polycrystalline silicon layer 53 1. Then, a photoresist pattern PR for defining an active layer is formed on the polycrystalline silicon layer 53 1.

The source and drain electrodes 50S, 50'S, 50D and 50'D are formed by depositing successively first and second conductive layers on the insulated substrate 500 and by etching the first and second conductive layers simultaneously and preferably by photolithography.

Alternatively, the source and drain electrodes 50S, 50'S, 50D and 50'D may be formed by depositing a first conductive layer on the insulated substrate 500, by etching the first conductive layer by photolithography, by depositing a second conductive layer on the whole surface of the substrate and by forming a clad type in which the second conductive layer covers the first conductive layer. In this case, the first conductive layer is preferably formed with Al for low electrical resistance and the second conductive layer is formed with Mo, Cr or MoW.

In the above description, the source and drain electrodes are formed to be of double layers. Alternatively, the source and drain electrodes of a single layer may be formed by depositing a single-layered conductive layer of conventional conductive substance and by patterning it by photolithography.

The insulating interlayer 52 1 insulates the source and drain electrodes 50S, 50'S, 50D and 50'D, and other components formed over the electrodes prevents the silicon layer from being penetrated by impurities from the substrate 500 during the process of crystallizing the amorphous silicon layer into the polycrystalline silicon layer 53 1 and thermally insulates the silicon layer from the substrate 500 or the source and drain electrodes. The insulating interlayer 52 1 is preferably formed with silicon oxide which is deposited at a thickness of about 3000–10000Å.

Figure 6B:
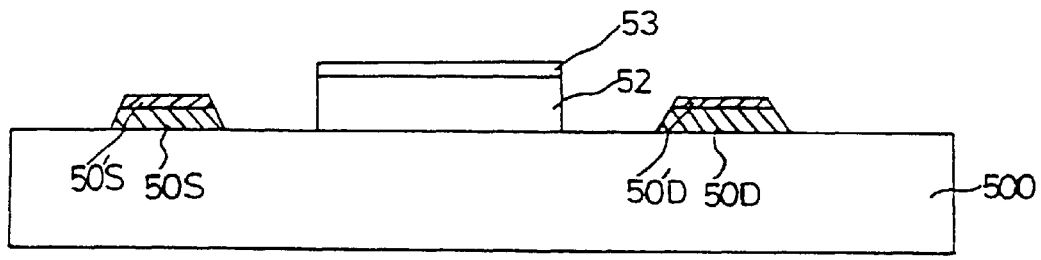

Referring to FIG. 6B, an active layer 53 is formed by etching the polycrystalline silicon under the photoresist pattern PR as a mask for forming the active layer. In this case, the polycrystalline silicon layer may be etched by dry etching. The source and drain electrodes 50S, 50'S, 50D and 50'D are exposed or the insulating interlayer remains very thin by etching the insulating interlayer 53 1 under the active layer 53 by using the photoresist pattern PR or the active layer as a mask. In this case, the undercutting of the insulating interlayer under the active layer should be avoided by etching the insulating interlayer through dry etching. Then, the photoresist pattern is removed for the subsequent steps.

Figure 6C:
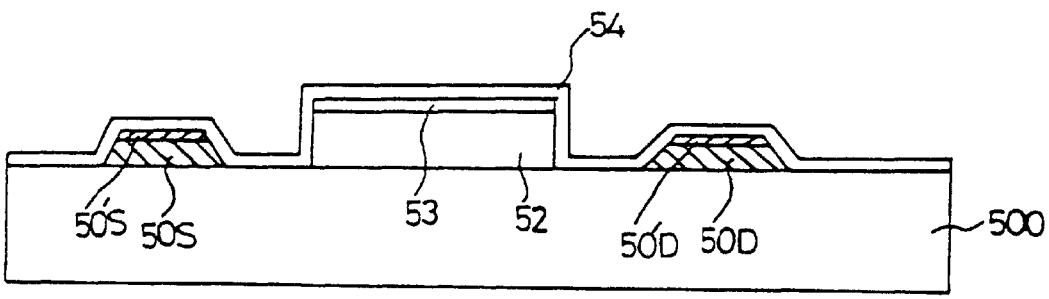

Referring to FIG. 6C, a gate insulating layer 54 which is about 1000Å thick is deposited on an exposed surface of the substrate 500, including the source and drain electrodes 50S, 50'S, 50D and 50'D. Thus, the active layer 53 and the source and drain electrodes 50S, 50'S, 50D and 50'D are covered with the gate insulating layer 54 only.

Figure 6D:
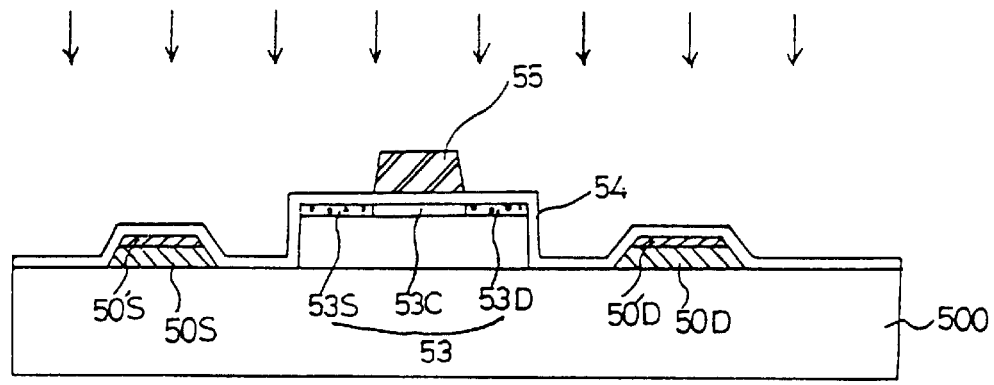

Referring to FIG. 6D, a gate electrode 55 is formed by depositing and etching a third conductive layer on the gate insulating layer 54 over the active layer 53 preferably by photolithography. A source region 53S and a drain region 53D are formed in the active layer 53 by doping an exposed surface of the substrate, including the gate electrode 55, with first or second type impurities. In this case, the first and second type impurities may be P and B, respectively.

Figure 6E:
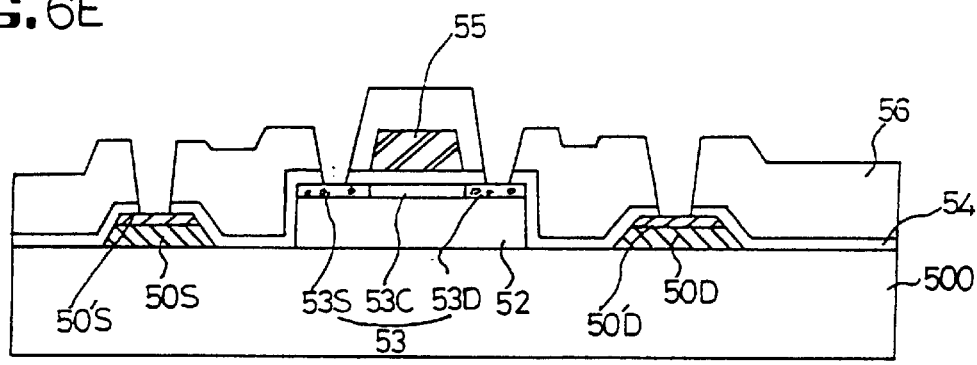

Referring to FIG. 6E, a passivation layer 56 is deposited on an exposed surface of the substrate 500, including the gate insulating layer 54. Thus, all the source and drain electrodes 50S, 50'S, 50D and 50'D and the source and drain regions 53S and 53D are covered with the same material. In this case, the passivation layer 56 may be formed with one of silicon oxide, silicon nitride, stacked layers of both silicon oxide and silicon nitride and an organic insulating layer.

Then, contact holes exposing the source and drain electrodes 50S, 50'S, 50D and 50'D and the source and drain regions 53S and 53D are formed, respectively, by etching the two layers of the gate insulating layer 54 and the passivation layer 56 under the same conditions to provide uniformity by photolithography.

Figure 6F:
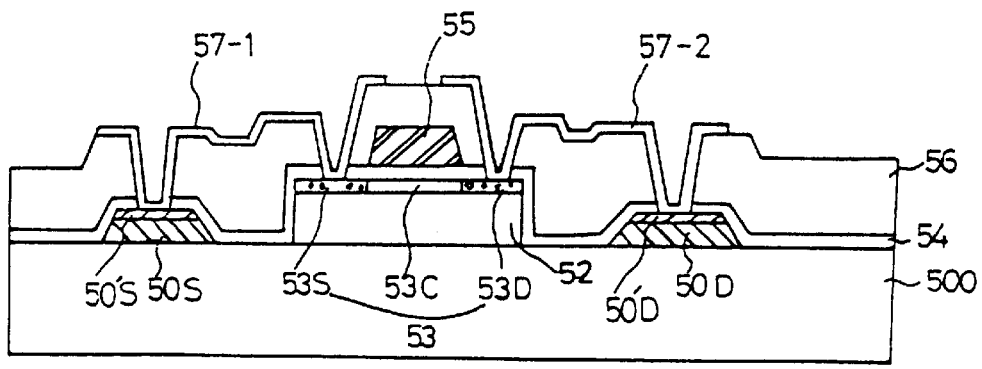

Referring to FIG. 6F, a transparent conductive layer is deposited on an exposed surface of the substrate. A first interconnection wire 57-1, connecting the source electrodes 50S and 50'S to the source region 53S, and a second interconnection wire 57-2, connecting the drain electrodes 50D and 50'D to the drain region 53D, are formed by etching the transparent conductive layer by photolithography. In this case, the transparent conductive layer may be substituted by a metal layer which is a conventional conductive layer.

Figure 7:
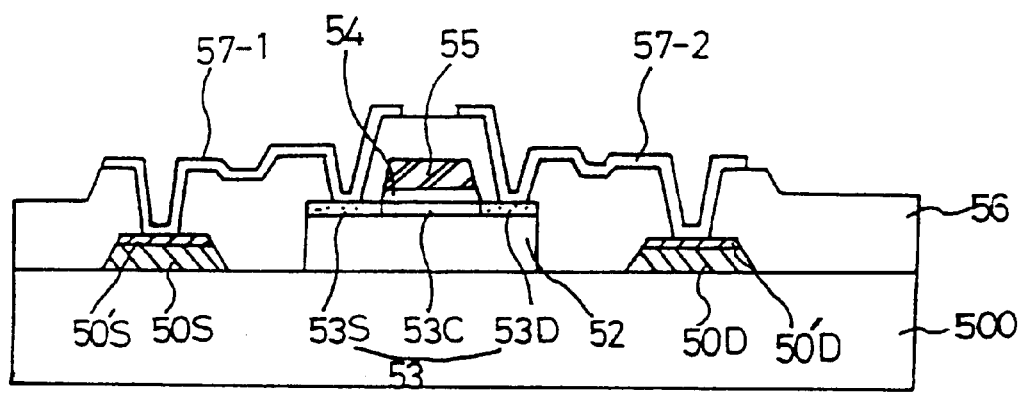
FIG. 7 shows a cross-sectional view of a thin film transistor according to a second embodiment of the present invention.

FIG. 7 shows a cross-sectional view of a thin film transistor according to a second embodiment of the present invention. Referring to FIG. 7, compared to the gate insulating layer in the first embodiment of the present invention, a gate insulating layer is etched selectively in the second embodiment of the present invention. This structure is achieved by forming a gate electrode 55 and by etching the gate insulating layer under the gate electrode 55 which is used as a mask by photolithography. In this case, the source and drain regions 53S and 53D of the active layer 53 and the source and drain electrodes 50S, 50'S, 50D and 50'D are exposed.

The fabrication steps described above with respect to the first embodiment are also applicable to the second embodiment of the present invention.

The active layer is exposed in the second embodiment of the present invention. Thus, it is possible to use less ion-implantation energy due to the absence of the gate insulating layer on source and drain electrodes 53S and 53D. Moreover, it is possible to form contact holes exposing the source electrodes 50S and 50'S, the source region 53S, the drain electrodes 50D and 50'D and the drain region 53D.

The thin film transistors shown in the first and second embodiments of the present invention are able to be used in a pixel array of a liquid crystal display, wherein the second interconnection wires are used as pixel electrodes, as well as in a circuit part of the LCD. The structures of the TFTs shown in the above embodiments are applied to a circuit part of an LCD.

Figure 8:
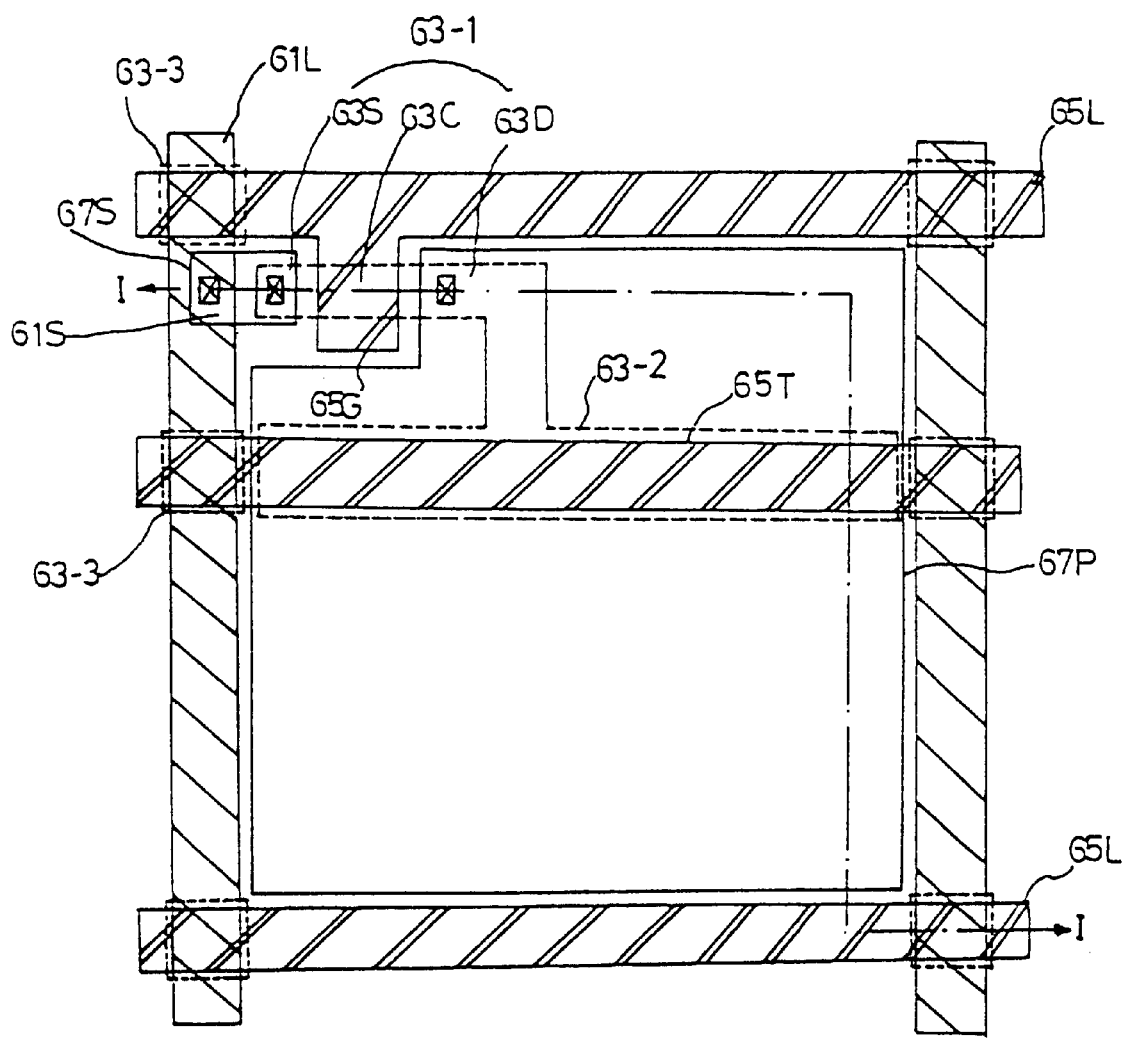
FIG. 8 shows a layout of a liquid crystal display according to a third embodiment of the present invention.

FIG. 8 shows a layout of a liquid crystal display according to a third embodiment of the present invention. A pixel is formed by crossing a data line 61L and a gate line 65L with each other which becomes a storage capacitor.

Referring to FIG. 8, a gate line 65L having a gate electrode 65G and a first capacitor electrode 65T cross each other at a data line 61L having a source electrode. A thin film transistor as a switching device includes the gate electrode 65G and an active layer 63-1 having a channel region 63C and a drain region 63D. The active layer is made of a polycrystalline silicon layer which is connected to an active layer and lies under the first capacitor electrode 65T. Hereinafter, the polycrystalline silicon layer under the first capacitor electrode will be called a semiconductor layer 63-2.

An insertion layer 63-3 is inserted into a crossing part between the data line 61L and the gate line 65L and the other crossing part between the data line 61L and the first capacitor electrode 65T. Thus, the insertion layer 63-3 reduces coupling capacitance due to the crossings of the lines and increases the resist stress of the insulating layer.

In FIG. 8, source electrode 61S is connected to the source region 63S by an interconnection wire 67S made of a transparent conductive layer. A pixel electrode 67P connected to the drain region 63D covers most parts of a pixel. The pixel electrode overlapped with the first capacitor electrode 65T functions as a second capacitor electrode.

Figure 9:
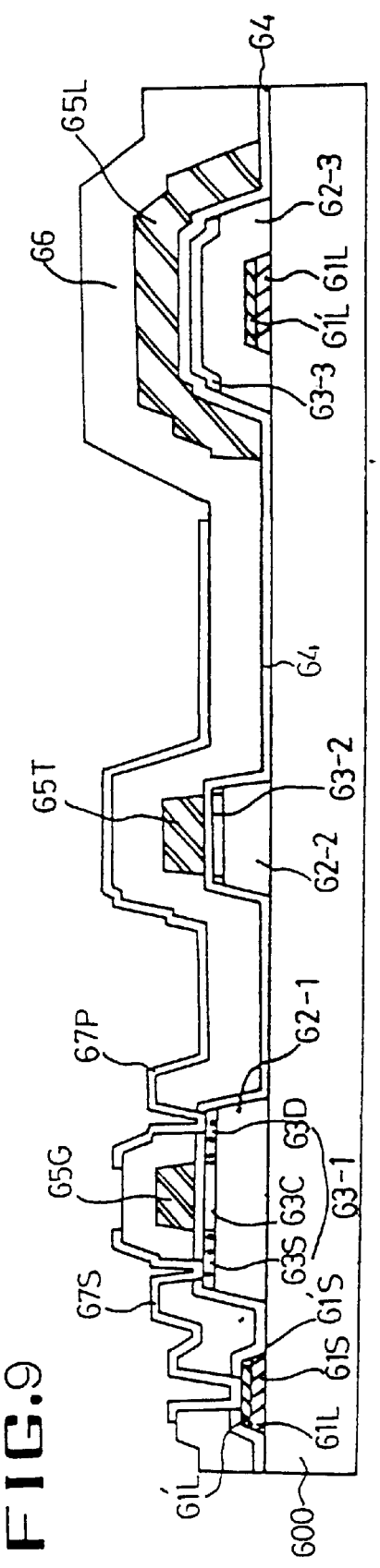
FIG. 9 shows a cross-sectional view of the liquid crystal display in FIG. 8 which is bisected by the cutting line I—I.

FIG. 9 shows a cross-sectional view of the liquid crystal display in FIG. 8 which is bisected by the cutting line I—I. Referring to FIG. 9, a data line 61'L, which has source electrodes 61S and 61'S and is comprised of at least a single layer, is formed on an insulated substrate 600.

A first insulating interlayer 62-1 beneath an active layer and a second insulating interlayer 62-2 beneath a first capacitor electrode 65T are formed on the insulated substrate 600. A third insulating interlayer 62-3 is formed on the data line 61L where a gate line 65L and the first capacitor electrode 65T cross each other.

On the first insulating interlayer 62-1, an active layer 63-1, having a source region 63S, a channel region 63C and a drain region 63D, is formed to have the same pattern of the first insulating interlayer 62-1. On the second insulating interlayer 62-2, a semiconductor layer 63-2 connected to the active layer is formed to have the same pattern of the second insulating interlayer 62-2. On the third insulating interlayer 62-3, a semiconductor insertion layer 63-3 made of the same substance of the active layer is formed to have the same pattern of the third insulating interlayer 62-3. A gate insulating layer 64 covers an exposed surface of the substrate.

The gate line 65L and the first capacitor electrode 65T, which cross each other at the data line 61L, are formed on the gate insulating layer 64. The gate line 65L has the gate electrode 65G overlapped with the channel region of the active layer 63-1. The first capacitor electrode 65T is formed on the semiconductor layer 63-2.

A passivation layer 66, which covers an exposed surface of the substrate including the gate line 65L and the first capacitor electrode 65T, is formed. Thereafter, contact holes exposing the source electrodes 61S and 61'S, the source region 63S and the drain region 63D are formed through the passivation layer 66 and the gate insulating layer 64.

An interconnection wire 67S, connecting the source electrodes 61S and 61'S to the source region 63S, and a pixel electrode 67P, which is connected to the drain region 63D and lies on the pixel, are formed on the passivation layer 66.

Figure 10A:
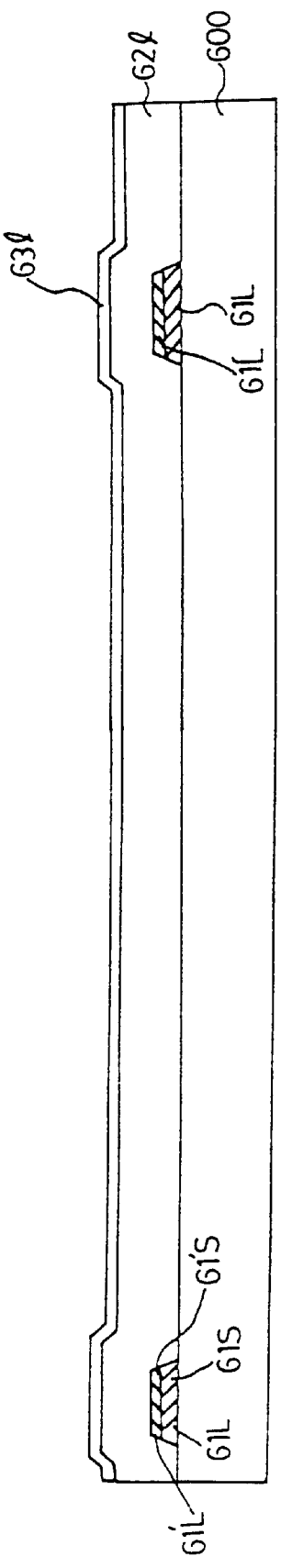

FIGS. 10A to 10F show cross-sectional views of fabricating the liquid crystal display shown in FIG. 8. Referring to FIG. 10A, after a data line 61'L of double layers having source electrodes 61S and 61'S has been formed on an insulated substrate 600, an insulating interlayer 62 1 is formed on an exposed surface of the substrate. After an amorphous silicon layer of about 500Å thick has been deposited on the insulating interlayer 62 1 a polycrystalline silicon layer 63 1 is formed by crystallizing the amorphous silicon layer.

A data line 61'L is formed by successively depositing first and second conductive layers on the insulated substrate 600 and by etching the first and second conductive layers simultaneously by photolithography.

Alternatively, the data line 61'L of a clad type in which a second layer covers a second layer may be formed by depositing and etching a first conductive layer on the insulated substrate 600 and by depositing and etching a second conductive layer on the first conductive layer. In this case, the first conductive layer is preferably formed with Al for low electrical resistance, and the second conductive layer is preferably deposited with Mo, Cr or MoW.

In the above description, the double-layered data line is formed. A single-layered data line may be formed instead by forming a single-layered conductive layer of conventional conductive substance known to one of ordinary skill in the art and by etching the layer by photolithography. Additionally, the data line may be comprised of at least a single layer.

The insulating interlayer 62 1 insulates the data line 61'L and other components formed over the line over one another and prevents the silicon layer from being penetrated by impurities in the substrate 500 during the process of crystallizing the amorphous silicon layer into the polycrystalline silicon layer 63 1. The insulating interlayer 62 1 also thermally insulates the silicon layer from the substrate. The insulating interlayer 62 1 is preferably formed with silicon oxide which is deposited at a thickness of about 3000–10000Å.

Referring to FIG. 10B, an active layer 63-1, a semiconductor layer 63-2 in the area of a storage capacitor and an insertion layer 63-3 over the data line 61'L, where a gate line 65L and a first capacitor electrode 65T will cross each other, are formed by etching the polycrystalline silicon layer by photolithography by use of a photoresist pattern as a mask. In this case, the etching step may be carried out by dry etching or other suitable processes known to one of ordinary skill in the art.

A first insulating interlayer 62-1 supporting the active layer 63-1, a second insulating interlayer 62-2 supporting the semiconductor layer 63-2 and a third insulating interlayer supporting the insertion layer 63-3 are formed by etching the insulating interlayer 62 1 under the patterned polycrystalline silicon layers 63-1, 63-2 and 63-3 by use of the photoresist pattern or the silicon layers 63-1, 63-2 and 63-3 as a mask. During this step, the data line 61'L, including the source electrodes 61S and 61'S, is exposed as well as the active layer 63-1. In this case, the undercutting of the insulating interlayer under the active layer should be avoided by etching the insulating interlayer by dry etching.

Referring to FIG. 10C, a gate insulating layer 64 which is about 1000Å thick is deposited on an exposed surface of the substrate, including the data line 61'L. Thus, the active layer 63-1 and the data line 61'L are thinly covered with the gate insulating layer 64. Then, a gate electrode 65G, a gate line 65L and a first capacitor electrode 65T are formed by depositing and etching a third conductive layer on the gate insulating layer 64 by photolithography.

The following step of exposing certain parts of the active layer 63-1 may be carried out by etching the gate insulating layer 64 by use of the gate electrode 65G, the gate line 65L and the first capacitor electrode 65T as masks.

Referring to FIG. 10D, a source region 63S and a drain region 63D are formed in the active layer 63-1 by doping an exposed surface of the substrate, including the gate line 65L and the first capacitor electrode 65T, with a first type of impurity of n type or a second type of impurity of p type. The first type of impurity may be P, and the second type may be B. Other suitable impurities known to one of ordinary skill in the art may also be used.

When the active layer is exposed due to the etching of the gate insulating layer 65 by use of the gate electrode 65 as a mask, it is possible to dope the active layer by using less ion-implantation energy than is used through the gate insulating layer.

Referring to FIG. 10E, a passivation layer 66 is deposited on an exposed surface of the substrate, including the gate insulating layer. Thus, all the source electrodes, the source region 63S and the drain region 63D are covered using the same conditions of the gate insulating and passivation layers 64 and 66. In this case, the passivation layer 66 may be formed with one of silicon oxide, silicon nitride, stacked layers of both silicon oxide and silicon nitride and an organic insulating layer.

Then, contact holes exposing the source region 63S, the source electrodes 61S and 61'S and the drain region 63D are formed, respectively, by etching the two layers of the gate insulating layer 64 and the passivation layer 66 under the same conditions to provide uniformity.

When the gate insulating layer 64 is etched by use of the gate electrode 65G as a mask, contact holes are formed by etching the passivation layer 66 only, which just covers the source region 63S, the source electrodes 61S and 61'S, and the drain region 63D.

Figure 10F:
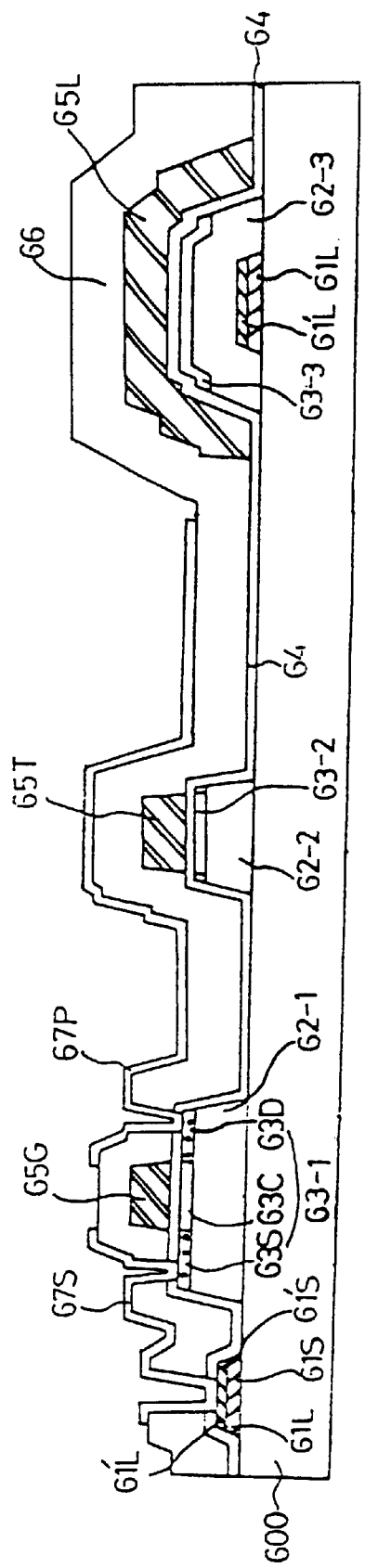

Referring to FIG. 10F, a transparent conductive layer is deposited on an exposed surface of the substrate. An interconnection wire 67S, connecting the source electrodes 61S and 61'S to the source region 63S, and a pixel electrode 67P, connected to the drain region 63D, are formed by etching the transparent conductive layer by photolithography. In this case, a portion of the pixel electrode 67P overlapped with the first capacitor electrode 65T functions as a second capacitor electrode.

As mentioned in the above description, the present invention is able to be applied to a display which uses TFTs of the BBC structure.

The present invention provides uniform contact holes which are formed by making both the insulating layer over an active layer and the other insulating layer over source and drain electrodes equal to each other in thickness and by etching the layers. Therefore, process failure is decreased and the yield of the product is increased.

It will be apparent to those skilled in the art that various modifications and variations can be made in a thin film transistor and in a fabricating method thereof of the present invention without departing from the spirit or scope of the invention. Thus, it is intended that the present invention covers the modifications and variations of this invention, provided they come within the scope of the appended claims and equivalents.

What is claimed is:

1. A thin film transistor comprising:

a substrate;

a source electrode and a drain electrode on the substrate;

a first insulating layer on the substrate, the first insulating layer having a predetermined pattern such that the first insulating layer is not in contact with either the source electrode or the drain electrode;

an active layer on the first insulating layer, the active layer having a source region, a channel region and a drain region;

a second insulating layer covering the active layer;

a gate electrode on the second insulating layer over the channel region;

a third insulating layer covering the gate electrode and an exposed surface of the substrate;

contact holes exposing the source and drain electrodes and the source and drain regions;

a first interconnection wire connecting the source electrode to the source region; and a second interconnection wire connecting the drain electrode to the drain region, wherein the contact holes are substantially the same height.

2. The thin film transistor according to claim 1, wherein the second insulating layer covers an exposed surface of the substrate including the active layer and the source and drain electrodes.

3. The thin film transistor according to claim 1, wherein the source and drain electrodes are comprised of double layers.

4. The thin film transistor according to claim 3, wherein a first layer of the source and drain electrodes is made of Al.

5. The thin film transistor according to claim 3, wherein a second layer of the source and drain electrodes is made of one of Mo and Cr.

6. The thin film transistor according to claim 1, wherein each one of the source and drain electrodes has a single-layered structure.

7. The thin film transistor according to claim 1, wherein the first insulating layer is about 3000–10000Å thick.

8. The thin film transistor according to claim 1, wherein the first insulating layer is made of silicon oxide.

9. The thin film transistor according to claim 1, wherein the third insulating layer is formed with either a single layer or double layers made of silicon oxide, silicon nitride, both silicon oxide and silicon nitride and an organic insulating layer.

10. The thin film transistor according to claim 1, wherein each one of the first and second interconnection wires is made of a transparent conductive layer.

11. The thin film transistor according to claim 1, wherein the first and second interconnection wires are used for connecting a first thin film transistor to a second thin film transistor to provide a CMOS structure.

12. A liquid crystal display comprising:
   a substrate;
   a data line on the substrate, the data line having a source electrode;
   a first insulating layer on the substrate, the first insulating layer having a predetermined pattern such that a first portion is formed, the first portion not being in contact with other portions of the first insulating layer, the first portion not being in contact with the source electrode;
   an active layer on the first insulating layer, the active layer having a source region, a channel region and a drain region;
   a second insulating layer covering an exposed surface of the substrate including the active layer and the data line;
   a gate line on the second insulating layer over the channel region, the gate line and the data line crossing each other, the gate line having a gate electrode;
   a third insulating layer on an exposed surface of the substrate including the gate line;
   contact holes exposing the source electrode, the source region and the drain region;
   an interconnection wire connecting the source electrode to the source region; and
   a pixel electrode connected to the drain region,
   wherein the contact holes are substantially the same height.

13. The liquid crystal display according to claim 12, wherein the first insulating layer is formed to be about 3000–10000Å thick.

14. The liquid crystal display according to claim 12, wherein an insertion layer made of substance for forming the active layer is inserted between the gate line and the data line and at a part where the data line and the gate line cross each other.

15. The liquid crystal display according to claim 14, the liquid crystal display further comprising:
   a first capacitor electrode on the second insulating layer over the first insulating layer, the first capacitor in parallel with the gate line;
   a second capacitor electrode comprised of a part of the pixel electrode overlapped with the first capacitor electrode; and
   a capacitor insulating layer comprised of a part of the third insulating layer between the first and second capacitor electrodes.

16. The liquid crystal display according to claim 14, wherein an insertion layer made of substance for forming the active layer is inserted between the data line and the first capacitor electrode and at a section where the data line and the first capacitor electrode cross each other.

17. The thin film transistor of claim 1, wherein a top surface of the first insulating layer is substantially completely covered by the active layer.

* * * * *